(12) United States Patent
Hu et al.

(10) Patent No.: US 11,133,764 B2
(45) Date of Patent: Sep. 28, 2021

(54) SIGNAL CONVERTER

(71) Applicant: ZHONGSHAN BROAD-OCEAN MOTOR CO., LTD., Zhongshan (CN)

(72) Inventors: Ge Hu, Zhongshan (CN); Wenqing Bian, Zhongshan (CN)

(73) Assignee: ZHONGSHAN BROAD-OCEAN MOTOR CO., LTD., Zhongshan (CN)

( * ) Notice: Subject to any disclaimer, the term of this patent is extended or adjusted under 35 U.S.C. 154(b) by 553 days.

(21) Appl. No.: 16/145,423

(22) Filed: Sep. 28, 2018

(65) Prior Publication Data
US 2019/0036728 A1 Jan. 31, 2019

Related U.S. Application Data

(63) Continuation-in-part of application No. PCT/CN2016/098488, filed on Sep. 8, 2016.

(30) Foreign Application Priority Data

Apr. 1, 2016 (CN) .......................... 201620276378.9

(51) Int. Cl.
H02P 6/00 (2016.01)
H03M 1/18 (2006.01)
(Continued)

(52) U.S. Cl.
CPC ................ H02P 6/00 (2013.01); B62D 5/046 (2013.01); H02J 7/0068 (2013.01); H03K 7/08 (2013.01); H03M 1/18 (2013.01); H04L 12/2836 (2013.01)

(58) Field of Classification Search
USPC .......................................................... 318/560
See application file for complete search history.

(56) References Cited

U.S. PATENT DOCUMENTS 5,850,195 A * 12/1998 Berlien, Jr. ........... H03M 1/129
341/137
6,016,700 A * 1/2000 Cuffe .................. G01N 29/0609
702/39
(Continued)

FOREIGN PATENT DOCUMENTS

| CN | 101814878 A | 8/2010 |
|----|-------------|--------|
| CN | 103208955 A | 7/2013 |

(Continued)

Primary Examiner — Bentsu Ro
(74) Attorney, Agent, or Firm — Matthias Scholl P.C.; Matthias Scholl

(57) ABSTRACT

A signal converter, including: a power circuit, a microprocessor, a plurality of input signal interface circuits, a first multiplexer switch, and an output signal interface circuit. The power circuit supplies power for each circuit of the signal converter. The plurality of input signal interface circuits is disposed side by side, and in operation, one of the plurality of input signal interface circuits is connected to the first multiplexer switch to work. The plurality of input signal interface circuits includes input terminals and output terminals. The input terminals receive corresponding input signals, and the output terminals are connected to the microprocessor. The microprocessor includes an output terminal which is connected to the output signal interface circuit. The microprocessor controls the first multiplexer switch to connect to one of the plurality of input signal interface circuits.

18 Claims, 10 Drawing Sheets

(51) Int. Cl.
*B62D 5/04* (2006.01)
*H02J 7/00* (2006.01)
*H03K 7/08* (2006.01)
*H04L 12/28* (2006.01)

(56) References Cited

U.S. PATENT DOCUMENTS

2008/0180048 A1  7/2008  Mullin et al.
2013/0320875 A1* 12/2013 Saes .................... H05B 45/382
                                              315/224
2015/0123582 A1  5/2015  Gu

FOREIGN PATENT DOCUMENTS

CN      103309251 A    9/2013
CN      205566146 U    9/2016

* cited by examiner

SIGNAL CONVERTER

CROSS-REFERENCE TO RELAYED APPLICATIONS

This application is a continuation-in-part of International Patent Application No. PCT/CN2016/098488 with an international filing date of Sep. 8, 2016, designating the United States, now pending, and further claims foreign priority benefits to Chinese Patent Application No. 201620276378.9 filed Apr. 1, 2016. The contents of all of the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND

This disclosure relates to a signal converter for electronically commutated motors (ECMs).

ECMs, also known as Brushless DC electric motors (BLDC motors), are used in direct drive fans in HVAC equipment; they are efficient and have a variety of speed controls to choose from.

As shown in FIGS. 2-4, a conventional ECM includes a main body 1 and a motor controller 2. The main body 1 includes a housing 11, a stator assembly 12 and a rotor assembly 13. The motor controller 2 includes a control box 22 and a control circuit board 21 mounted in the control box 22. The control box 22 is mounted in the tail of the housing 11. The control circuit board 21 includes a power supply circuit, a microprocessor MCU, an IGBT (Insulated Gate Bipolar Transistor) inverter circuit, an operating parameter detection unit, and an interface signal processing circuit.

During operation, the motor controller requires that the motor is matched to the control system of specific electrical equipment. This is because different control systems must match different control signals.

Conventionally, for each kind of control signal and for each kind of control system, a specific ECM and corresponding motor controller are developed. This keeps the development and production costs high.

SUMMARY

Disclosed is a signal converter for electronically commutated motors (ECMs). The signal converter can enable the electronically commutated motors to adapt to the control signals of various electrical equipment and/or various control signals of one electrical equipment. This facilitates the management and application of the motors.

Disclosed is a signal converter for connecting electrical equipment and an ECM, the signal converter being configured to convert the control signal from the electrical equipment into an input signal recognizable to the ECM. The signal converter comprises: a power circuit, a microprocessor, a plurality of input signal interface circuits, a first multiplexer switch, and an output signal interface circuit; the power circuit supplies power for each circuit of the signal converter; the plurality of input signal interface circuits is disposed side by side, and in operation, one of the plurality of input signal interface circuits is connected to the first multiplexer switch to work; the plurality of input signal interface circuits comprises input terminals and output terminals; the input terminals receive corresponding input signals, and the output terminals are connected to the microprocessor; the microprocessor comprises an output terminal which is connected to the output signal interface circuit; and the microprocessor controls the first multiplexer switch to connect to one of the plurality of input signal interface circuits.

The microprocessor can comprise a Bluetooth module; an external mobile equipment sends instructions to the microprocessor via the Bluetooth module, and the microprocessor controls the first multiplexer switch to select one of the plurality of input signal interface circuits to work according to the instructions.

The microprocessor can comprise a serial communication circuit; an external equipment sends instructions to the microprocessor via the serial communication circuit, and the microprocessor controls the first multiplexer switch to select one of the plurality of input signal interface circuits to work according to the instructions.

The signal converter can further comprise a rotary switch or button; instructions are sent to the microprocessor via the rotary switch or button, and the microprocessor controls the first multiplexer switch to select one of the plurality of input signal interface circuits to work according to the instructions.

The signal converter can further comprise an input signal status indicator, a power status indicator, and an output signal status indicator.

The input signals can comprise 0-10 VDC signals, pulse-width modulation (PWM) signals, 4-20 mA signals, serial communication signals, line voltage switching signals and 24 V temperature control switching signals; the serial communication signals are corresponding to communication protocols, and the signal converter supports multiple serial communication signal inputs with different communication protocols.

The power circuit can comprise a plurality of power input interface circuits and a second multiplexer switch; the plurality of power input interface circuits is disposed side by side; input terminals of the plurality of power input interface circuits are connected to corresponding input powers, and output terminals of the plurality of power input interface circuits are connected to the second multiplexer switch; in operation, the microprocessor controls the second multiplexer switch to select one of the plurality of power input interface circuits to work.

The input powers can comprise +5 VDC USB power supply, between +12 VDC and +24 VDC input power, and dry battery DC power supply.

A plurality of output signal interface circuits can be disposed side by side; the plurality of output signal interface circuits is connected to a third multiplexer switch; the microprocessor controls the third multiplexer switch to select one of the plurality of output signal interface circuits to output a corresponding output signal via an output terminal of the plurality of output signal interface circuits.

The output signal can comprise a 0-10 VDC signal, pulse-width modulation (PWM) signal, 4-20 mA signal, serial communication signal, line voltage switching signal and 24 V temperature control switching signal.

The power circuit can supply +24 VDC or +12 VDC power to a system controller or potentiometer of a user side.

Advantages of the signal converter for electronically commutated motors (ECMs) as described in the disclosure are summarized as follows:

1. The signal converter can enable the electronically commutated motors to adapt to the control signals of different electrical equipment or different control signals of one electrical equipment, thus facilitating the management and application of the motors.

2. The arrangement of the Bluetooth module and the serial communication circuit simplifies the selection of the first multiplexer switch for one of the plurality of input signal interface circuits.

3. The input signal status indicator, the power status indicator, and the output signal status indicator can directly indicate whether the input signals, the power supply and the output signals are correct or not.

4. The input powers comprise +5 VDC USB power supply, between +12 VDC and +24 VDC input power, and dry battery DC power supply, meeting different input power requirements.

5. The plurality of output signal interface circuits is corresponding to different output signals, which expands the application scope of the ECMs.

DETAILED DESCRIPTION

Figure 1:
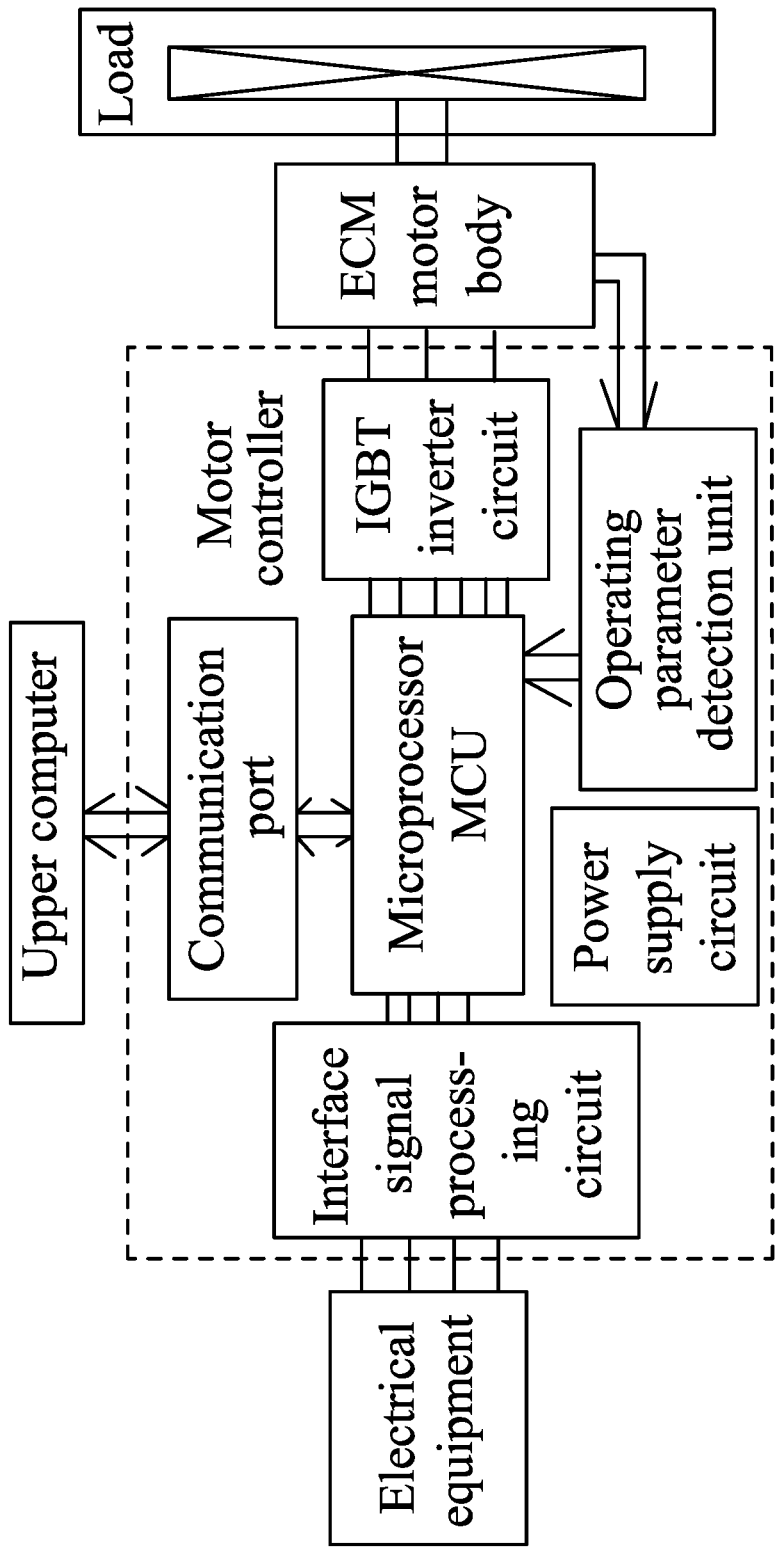
FIG. 1 is a schematic block diagram of a connection of an electrical equipment and an ECM in the related art.
Figure 2:
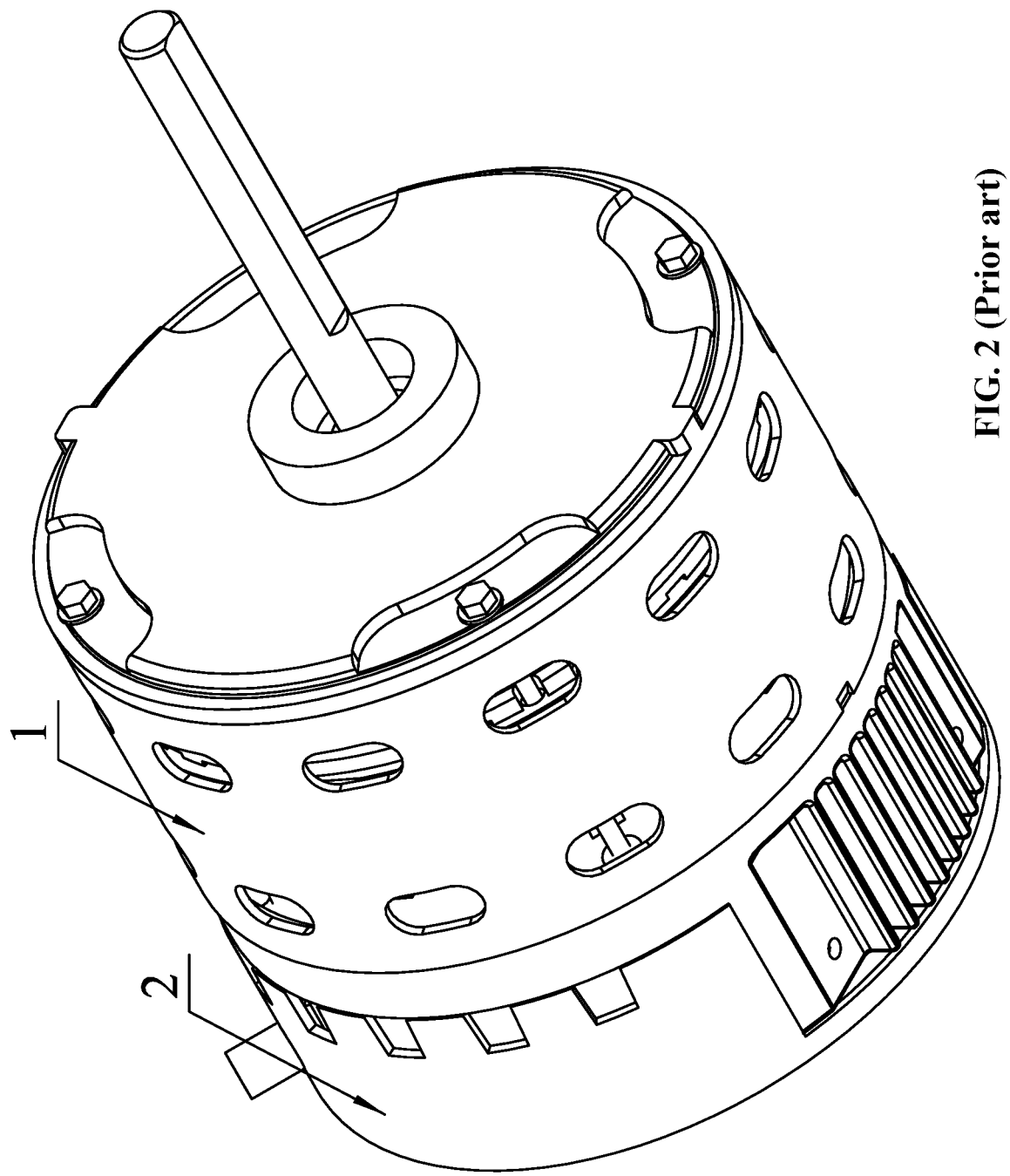
FIG. 2 is a stereogram of an ECM in the related art.
Figure 3:
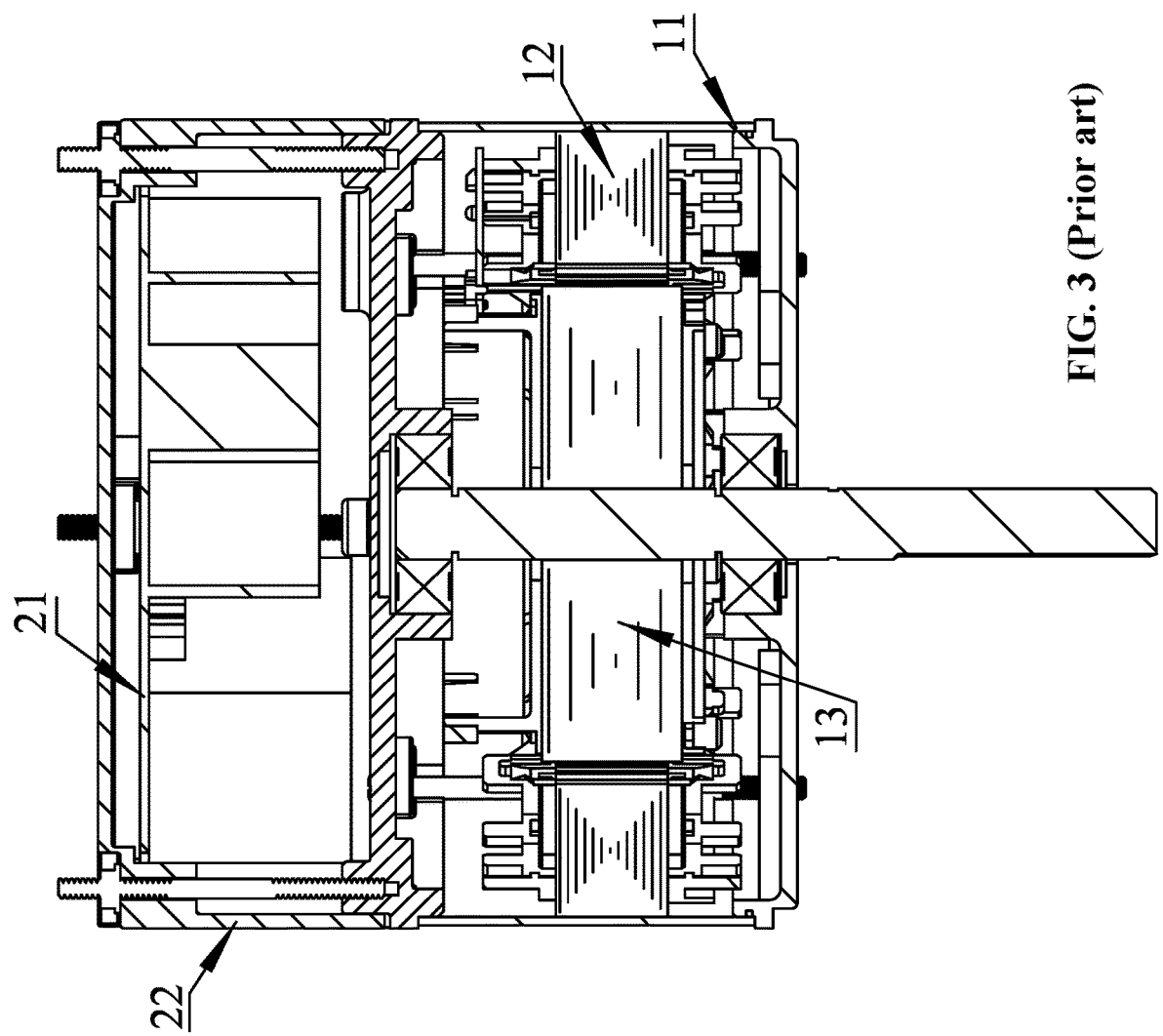
FIG. 3 is a sectional view of a main body of an ECM in the related art.
Figure 4:
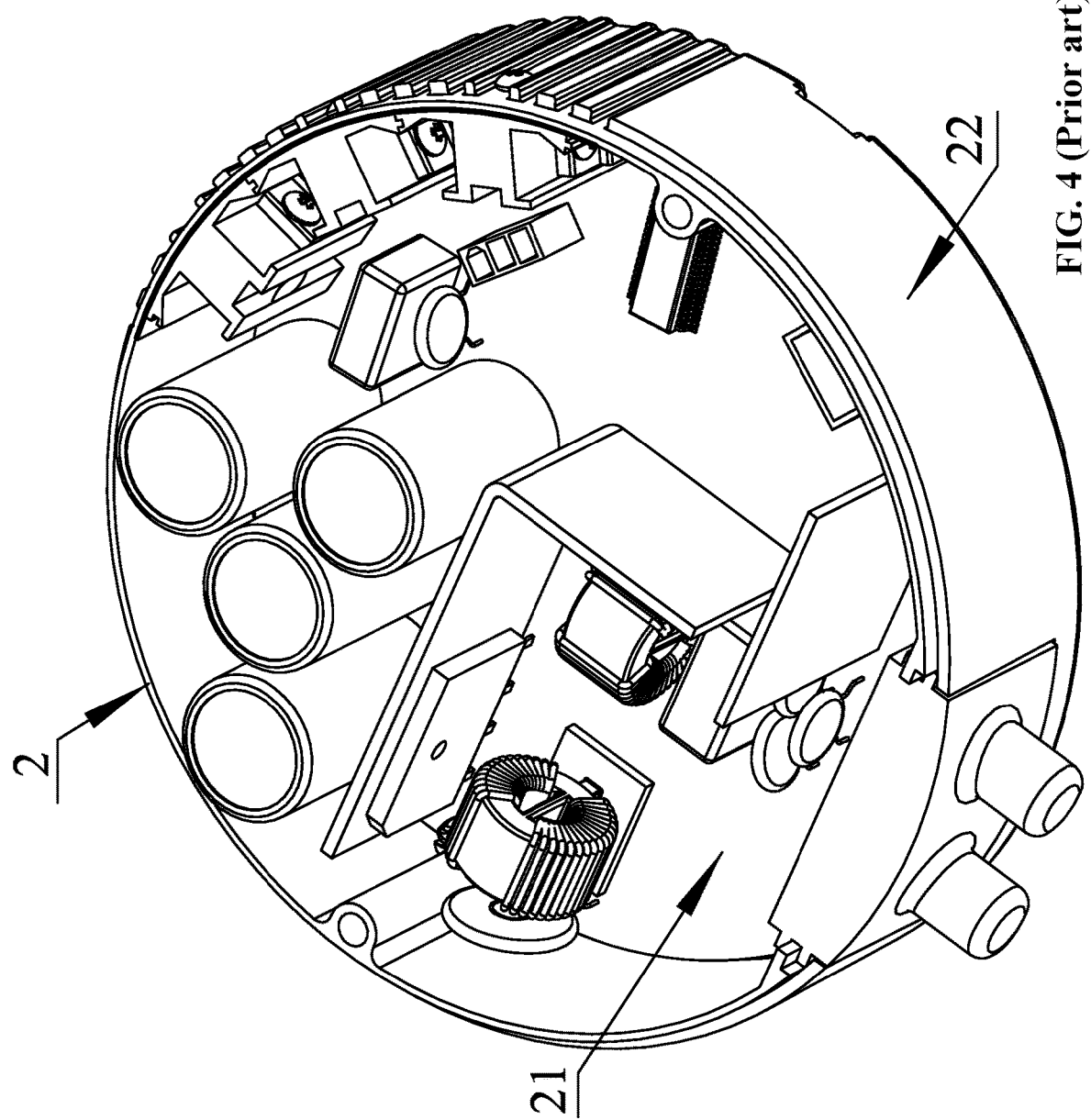
FIG. 4 is a schematic diagram of a motor controller of an ECM in the related art.
Figure 5:
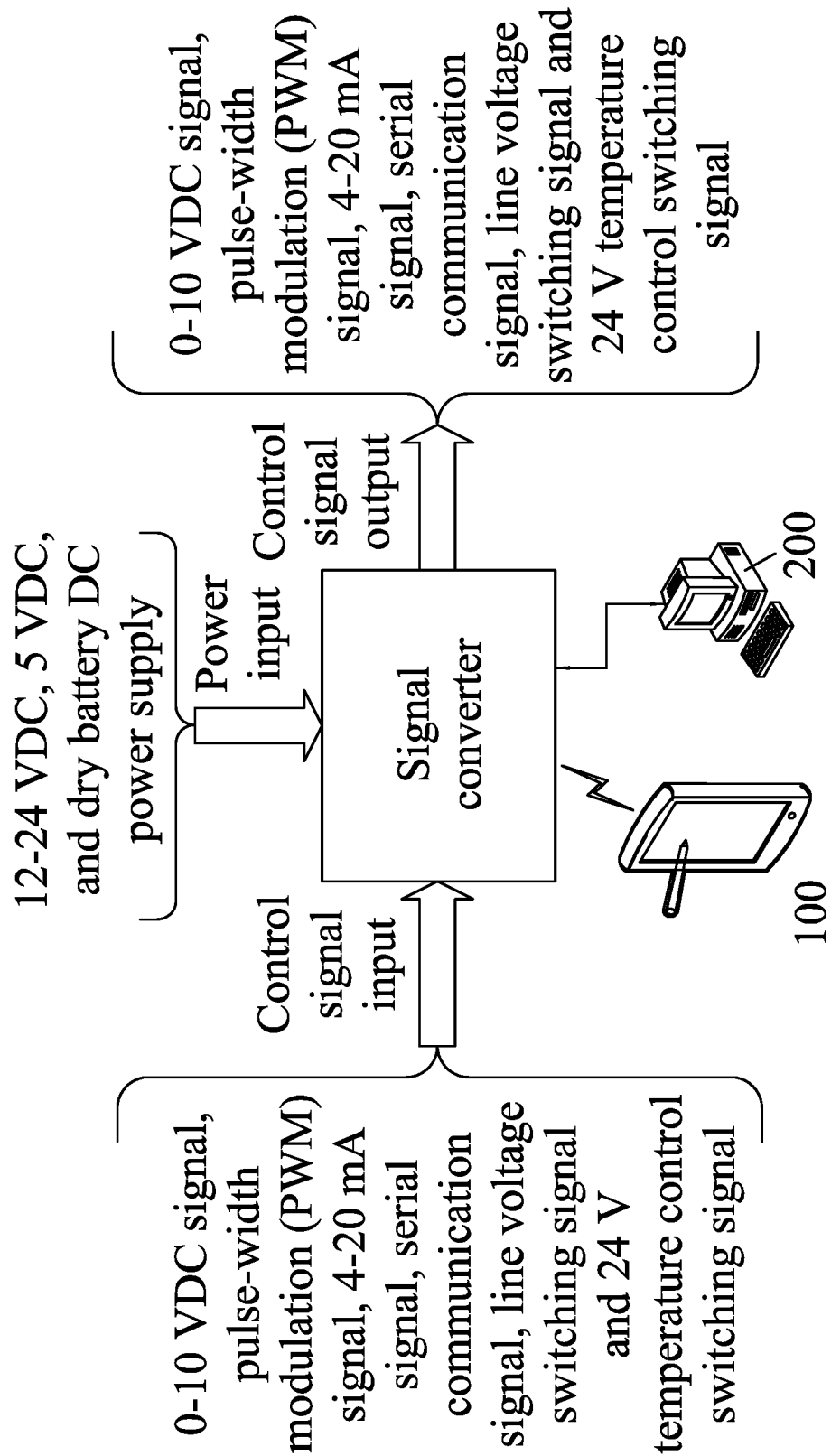
FIG. 5 is a working principle diagram of a signal converter as described in the disclosure.
Figure 6:
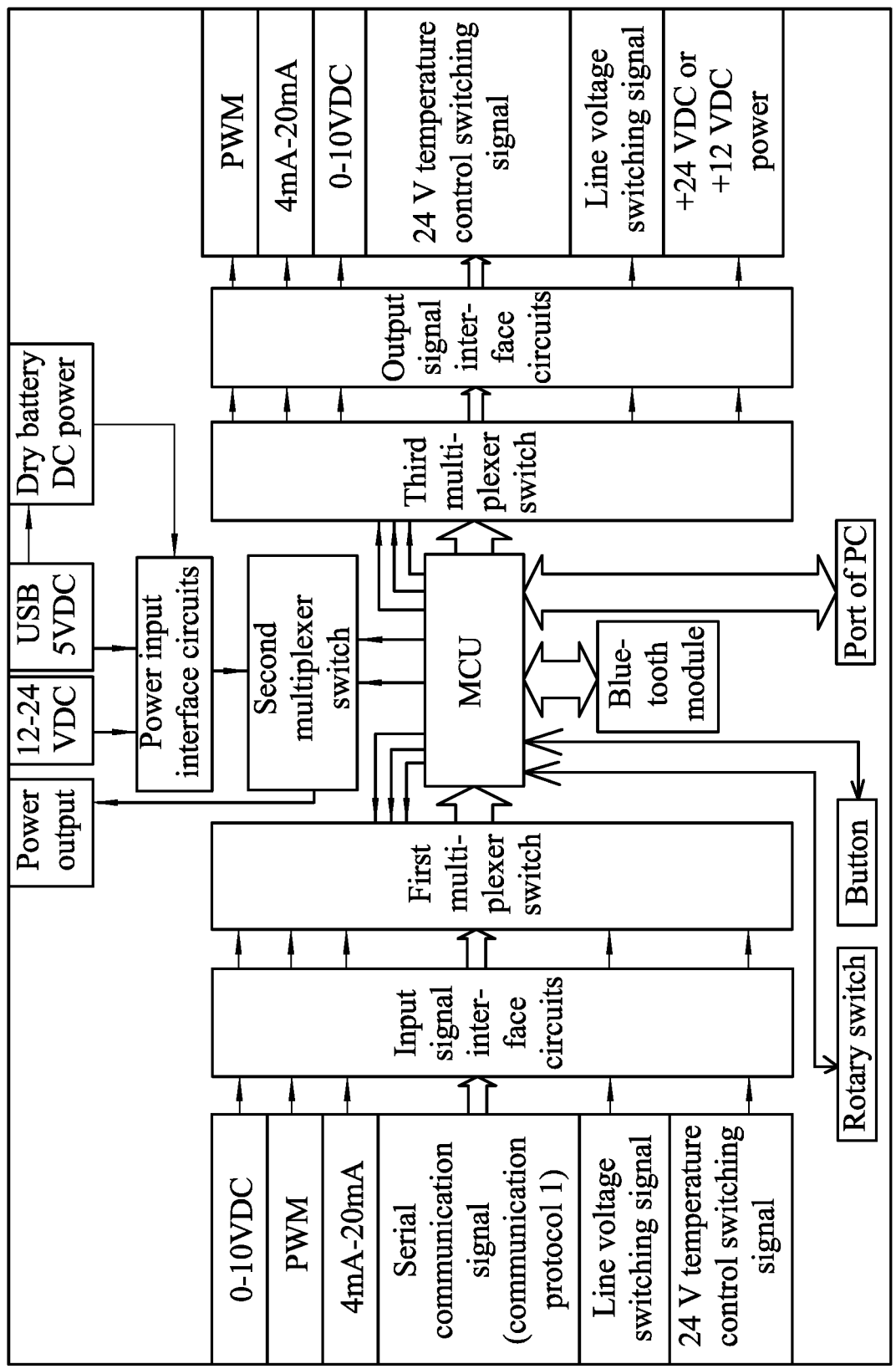
FIG. 6 is a circuit principle diagram of a signal converter as described in the disclosure.
Figure 7:
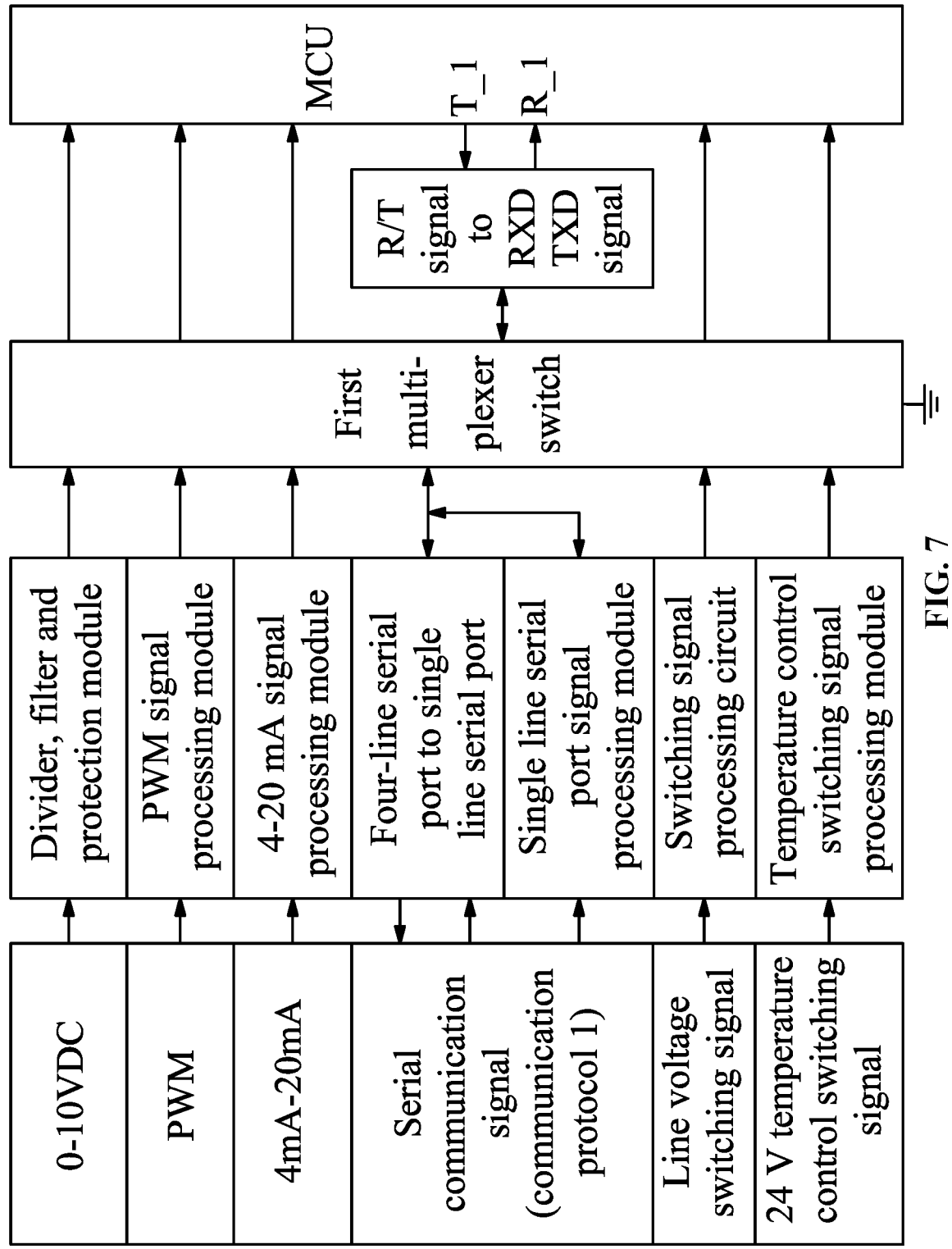
FIG. 7 is a circuit diagram of a plurality of input signal interface circuits and a microprocessor as described in the disclosure.
Figure 8:
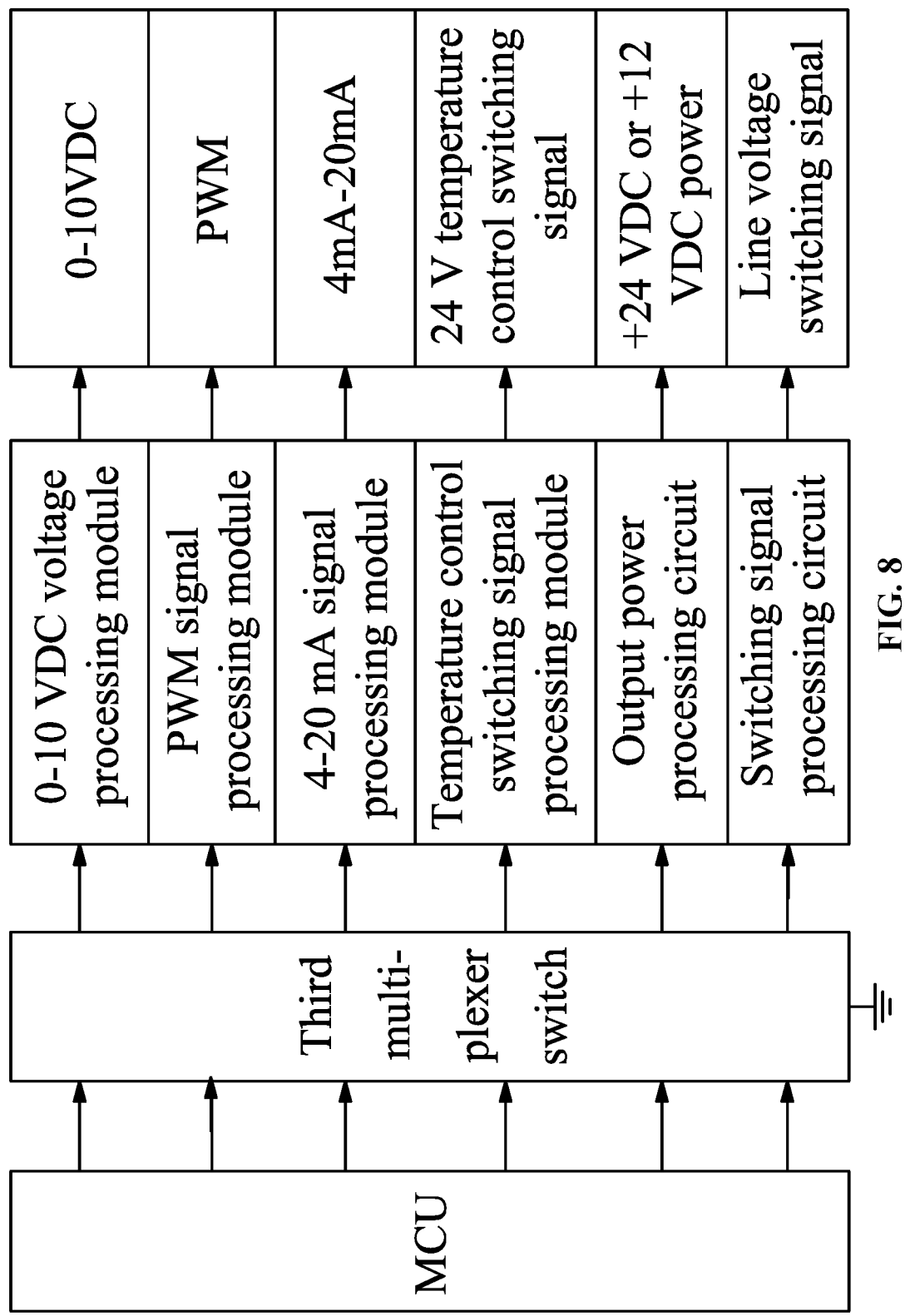
FIG. 8 is a circuit diagram of a microprocessor and a plurality of output signal interface circuits as described in the disclosure.
Figure 9:
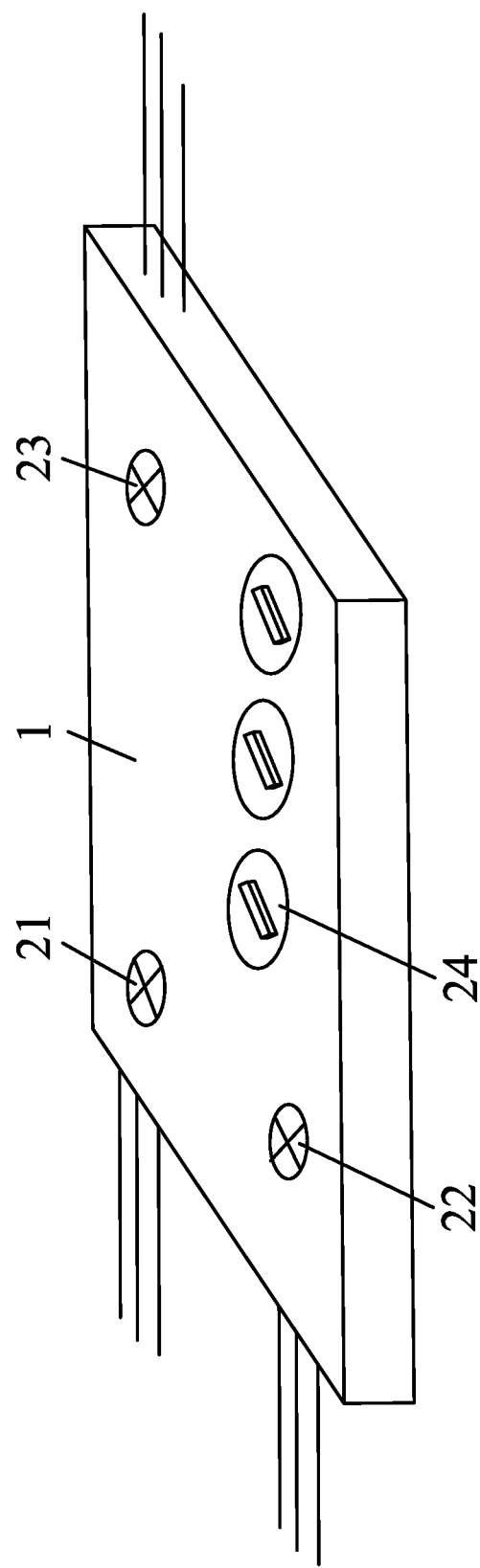
FIG. 9 is a stereogram of a signal converter as described in the disclosure.

To further illustrate, embodiments detailing a signal converter are described below. It should be noted that the following embodiments are intended to describe and not to limit the disclosure.

As shown in FIGS. 5-9, provided is a signal converter for electronically commutated motors (ECMs). The signal converter is disposed between an electrical equipment (such as a system controller of heating, ventilating and air conditioning (HVAC) and an ECM. The signal converter can convert the control signal from the electrical equipment into an input signal recognizable to the ECM. The signal converter comprises: a power circuit, a microprocessor, a plurality of input signal interface circuits, a first multiplexer switch, and an output signal interface circuit; the power circuit supplies power for each circuit of the signal converter; the plurality of input signal interface circuits is disposed side by side, and in operation, one of the plurality of input signal interface circuits is connected to the first multiplexer switch to work; the plurality of input signal interface circuits comprises input terminals and output terminals; the input terminals receive corresponding input signals, and the output terminals are connected to the microprocessor; the microprocessor comprises an output terminal which is connected to the output signal interface circuit; and the microprocessor controls the first multiplexer switch to connect to one of the plurality of input signal interface circuits.

The microprocessor can comprise a Bluetooth module. The microprocessor is programmed by an external mobile equipment 100 via the Bluetooth module. The external mobile equipment 100 sends instructions to the microprocessor via the Bluetooth module, and the microprocessor controls the first multiplexer switch to select one of the plurality of input signal interface circuits to work according to the instructions. The microprocessor can comprise a serial communication circuit; an external equipment 200 sends instructions to the microprocessor via the serial communication circuit, and the microprocessor controls the first multiplexer switch to select one of the plurality of input signal interface circuits to work according to the instructions. The signal converter further comprises a rotary switch or button; instructions are sent to the microprocessor via the rotary switch or button, and the microprocessor controls the first multiplexer switch to select one of the plurality of input signal interface circuits to work according to the instructions. The signal converter comprises a housing 1 and a circuit board disposed in the housing 1. All the circuits are disposed on the circuit board. The housing 1 is provided with an input signal status indicator 21, a power status indicator 22, and an output signal status indicator 23. Specifically, for example, if the indicator light is always on, it means the selection is correct, and if the indicator light constantly flashes, it means the selection is wrong, and the user needs to check whether the wiring is correct. Specifically, the programming software of an external mobile equipment 100, such as a smartphone, can select the signal input type, power input type and signal output type, when the smartphone transmits an instruction to the Bluetooth module, the Bluetooth module receives and transfers the instruction to the microprocessor MCU, the microprocessor MCU controls a corresponding multiplexer switch to select a corresponding signal input type, power input type and signal output type, and when the status indicator light is normally on, the signal conversion can be started. Or perhaps, the external equipment 200 is a PC, the programming software of the PC can select the signal input type, power input type and signal output type, when the PC transmits an instruction to the serial communication circuit, the serial communication circuit receives and transfers the instruction to the microprocessor MCU, the microprocessor MCU controls a corresponding multiplexer switch to select a corresponding signal input type, power input type and signal output type, and when the status indicator light is normally on, the signal conversion can be started.

Preferably, the housing 1 comprises a plurality of rotary switches 24; the rotary switches 24 can select a signal input type, power input type and signal output type. Specifically, when the user rotates the rotary switches 24, the rotary switches 24 transmit an instruction to the microprocessor MCU, the microprocessor MCU controls a corresponding multiplexer switch to select a signal input type, power input type and signal output type, and when the status indicator light is normally on, the signal conversion can be started. Or perhaps, the housing 1 can be provided with a plurality of buttons, the function of the buttons is consistent with that of the rotary switches, that is, to select a signal input type, power input type and signal output type, which will not be repeated herein.

The input signals comprise 0-10 VDC signals, pulse-width modulation (PWM) signals, 4-20 mA signals, serial communication signals, line voltage switching signals and 24 V temperature control switching signals. Preferably, the plurality of input signal interface circuits comprises a divider, filter and protection module for inputting 0-10 VDC signals, a PWM signal processing module for inputting PWM signals, a 4-20 mA signal processing module for inputting 4-20 mA signals, a four-line serial port to single line serial port and single line serial port signal processing module for inputting serial communication signals, a line voltage switching signal processing module for inputting line voltage switching signals, and a temperature control switching signal processing module for inputting 24 V temperature control switching signals. The serial communication signals are corresponding to communication protocols, and the signal converter supports multiple serial communication signal inputs with different communication protocols. The signal converter supports multiple communication protocols 1, 2, 3, and so on, such as ClimateTalk, customized Modbus, of the input end. The protocol can be selected through the mobile App or PC software or panel button.

The power circuit comprises a plurality of power input interface circuits and a second multiplexer switch; the plurality of power input interface circuits is disposed side by side; input terminals of the plurality of power input interface circuits are connected to corresponding input powers, and output terminals of the plurality of power input interface circuits are connected to the second multiplexer switch; in operation, the microprocessor controls the second multiplexer switch to select one of the plurality of power input interface circuits to work. The input powers comprise +5 VDC USB power supply, between +12 VDC and +24 VDC input power, and dry battery DC power supply. The output voltage of each power input interface circuit is standard, such as +3.3 VDC, +12 VDC, and so on, so as to provide standard power supply for each circuit. Each power input interface circuit is just a simple DC-DC conversion. There are detailed examples in the textbooks, which are not described herein.

A plurality of output signal interface circuits is disposed side by side; the plurality of output signal interface circuits is connected to a third multiplexer switch; the microprocessor controls the third multiplexer switch to select one of the plurality of output signal interface circuits to output a corresponding output signal via an output terminal of the plurality of output signal interface circuits. The output signal comprises a 0-10 VDC signal, pulse-width modulation (PWM) signal, 4-20 mA signal, serial communication signal, line voltage switching signal and 24 V temperature control switching signal. The power circuit can supply +24 VDC or +12 VDC power to a system controller or potentiometer of a user side. Preferably, the plurality of output signal interface circuits comprises a 0-10 VDC voltage processing module for outputting 0-10 VDC signals, a PWM signal processing module for outputting PWM signals, a 4-20 mA signal processing module for outputting 4-20 mA signals, a temperature control switching signal processing module for outputting 24 V temperature control switching signals, a line voltage switching signal processing module for outputting line voltage switching signals, and an output power processing circuit for outputting 24 V or 12 VDC power supply. The aforesaid output signal interface circuits are all related art and are not repeated herein.

Figure 10:
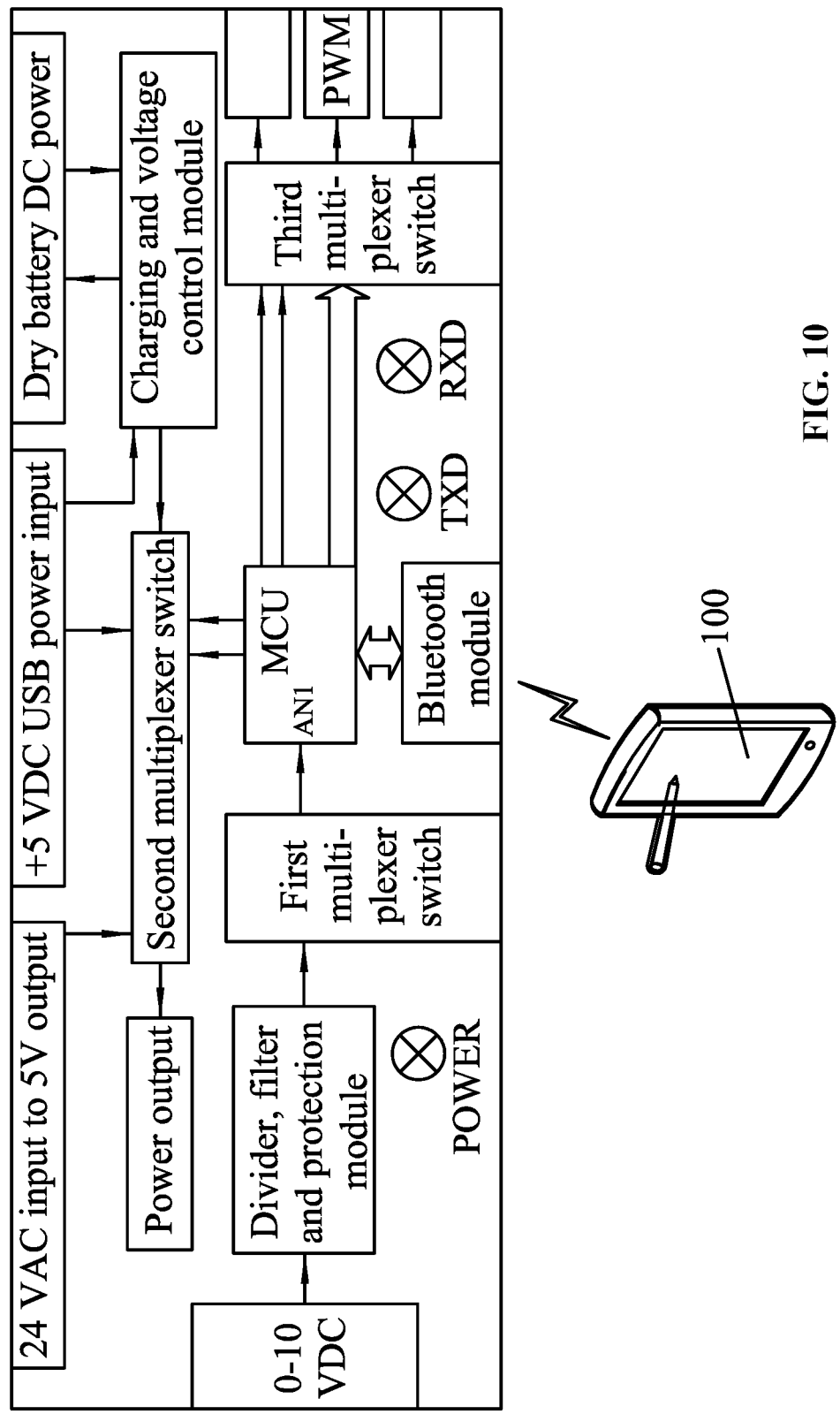
FIG. 10 is an application block diagram of a signal converter as described in the disclosure.

FIG. 10 illustrates a specific application of the signal converter as described in the disclosure. The programming software of a smartphone transmits an instruction to the Bluetooth module, the Bluetooth module receives and transfers the instruction to the microprocessor MCU, the microprocessor MCU controls the first multiplexer switch to select the divider, filter and protection module to input 0-10 VDC signals to an electrical equipment, the microprocessor MCU convert the 0-10 VDC signals into PWM signals and controls the third multiplexer switch to select the PWM signal processing module to work and output the PWM signals to the ECM.

It will be obvious to those skilled in the art that changes and modifications may be made, and therefore, the aim in the appended claims is to cover all such changes and modifications.

What is claimed is:

1. A signal converter, comprising:
  a power circuit;
  a microprocessor;
  a plurality of input signal interface circuits;
  a first multiplexer switch; and
  an output signal interface circuit;
  wherein:
    the power circuit supplies power for each circuit of the signal converter;
    the plurality of input signal interface circuits is disposed side by side, and in operation, one of the plurality of input signal interface circuits is connected to the first multiplexer switch to work;
    the plurality of input signal interface circuits comprises input terminals and output terminals; the input terminals receive corresponding input signals, and the output terminals are connected to the microprocessor;
    the microprocessor comprises an output terminal which is connected to the output signal interface circuit; and
    the microprocessor controls the first multiplexer switch to connect to one of the plurality of input signal interface circuits.

2. The signal converter of claim 1, wherein:
  the microprocessor comprises a Bluetooth module; an external mobile equipment sends instructions to the microprocessor via the Bluetooth module, and the microprocessor controls the first multiplexer switch to select one of the plurality of input signal interface circuits to work according to the instructions.

3. The signal converter of claim 2, further comprising an input signal status indicator, a power status indicator, and an output signal status indicator.

4. The signal converter of claim 2, wherein the input signals comprises 0-10 VDC signals, pulse-width modulation (PWM) signals, 4-20 mA signals, serial communication signals, line voltage switching signals and 24 V temperature control switching signals; the serial communication signals are corresponding to communication protocols, and the signal converter supports multiple serial communication signal inputs with different communication protocols.

5. The signal converter of claim 2, wherein the power circuit comprises a plurality of power input interface circuits and a second multiplexer switch; the plurality of power input interface circuits is disposed side by side; input terminals of the plurality of power input interface circuits are connected to corresponding input powers, and output terminals of the plurality of power input interface circuits are connected to the second multiplexer switch; in operation, the microprocessor controls the second multiplexer switch to select one of the plurality of power input interface circuits to work.

6. The signal converter of claim 5, wherein the input powers comprise +5 VDC USB power supply, between +12 VDC and +24 VDC input power, and dry battery DC power supply.

7. The signal converter of claim 2, wherein a plurality of output signal interface circuits is disposed side by side; the plurality of output signal interface circuits is connected to a third multiplexer switch; the microprocessor controls the third multiplexer switch to select one of the plurality of output signal interface circuits to output a corresponding output signal via an output terminal of the plurality of output signal interface circuits.

8. The signal converter of claim 7, wherein the output signal comprises a 0-10 VDC signal, pulse-width modulation (PWM) signal, 4-20 mA signal, serial communication signal, line voltage switching signal and 24 V temperature control switching signal.

9. The signal converter of claim 7, wherein the power circuit supplies +24 VDC or +12 VDC power to a system controller or potentiometer of a user side.

10. The signal converter of claim 1, wherein:
the microprocessor comprises a serial communication circuit; an external equipment sends instructions to the microprocessor via the serial communication circuit, and the microprocessor controls the first multiplexer switch to select one of the plurality of input signal interface circuits to work according to the instructions.

11. The signal converter of claim 1, further comprising a rotary switch or button, wherein: instructions are sent to the microprocessor via the rotary switch or button, and the microprocessor controls the first multiplexer switch to select one of the plurality of input signal interface circuits to work according to the instructions.

12. The signal converter of claim 1, further comprising an input signal status indicator, a power status indicator, and an output signal status indicator.

13. The signal converter of claim 1, wherein the input signals comprises 0-10 VDC signals, pulse-width modulation (PWM) signals, 4-20 mA signals, serial communication signals, line voltage switching signals and 24 V temperature control switching signals; the serial communication signals are corresponding to communication protocols, and the signal converter supports multiple serial communication signal inputs with different communication protocols.

14. The signal converter of claim 1, wherein the power circuit comprises a plurality of power input interface circuits and a second multiplexer switch; the plurality of power input interface circuits is disposed side by side; input terminals of the plurality of power input interface circuits are connected to corresponding input powers, and output terminals of the plurality of power input interface circuits are connected to the second multiplexer switch; in operation, the microprocessor controls the second multiplexer switch to select one of the plurality of power input interface circuits to work.

15. The signal converter of claim 14, wherein the input powers comprise +5 VDC USB power supply, between +12 VDC and +24 VDC input power, and dry battery DC power supply.

16. The signal converter of claim 1, wherein a plurality of output signal interface circuits is disposed side by side; the plurality of output signal interface circuits is connected to a third multiplexer switch; the microprocessor controls the third multiplexer switch to select one of the plurality of output signal interface circuits to output a corresponding output signal via an output terminal of the plurality of output signal interface circuits.

17. The signal converter of claim 16, wherein the output signal comprises a 0-10 VDC signal, pulse-width modulation (PWM) signal, 4-20 mA signal, serial communication signal, line voltage switching signal and 24 V temperature control switching signal.

18. The signal converter of claim 16, wherein the power circuit supplies +24 VDC or +12 VDC power to a system controller or potentiometer of a user side.

* * * * *